United States Patent
Daly

(10) Patent No.: US 9,614,331 B2
(45) Date of Patent: Apr. 4, 2017

(54) SIGNAL REFERENCING FOR MEMORY

(71) Applicant: Intel Corporation, Santa Clara, CA (US)

(72) Inventor: Gregory M. Daly, Seattle, WA (US)

(73) Assignee: Intel Corporation, Santa Clara, CA (US)

( * ) Notice: Subject to any disclaimer, the term of this patent is extended or adjusted under 35 U.S.C. 154(b) by 336 days.

(21) Appl. No.: 13/925,400

(22) Filed: Jun. 24, 2013

(65) Prior Publication Data

US 2014/0376194 A1    Dec. 25, 2014

(51) Int. Cl.
| | |
|---|---|
| H05K 1/11 | (2006.01) |
| H01R 13/6599 | (2011.01) |
| H05K 1/14 | (2006.01) |
| H05K 7/00 | (2006.01) |
| G06K 7/00 | (2006.01) |
| H01R 13/658 | (2011.01) |
| H01R 12/00 | (2006.01) |
| H01R 13/6586 | (2011.01) |
| H01R 12/71 | (2011.01) |
| H01R 12/72 | (2011.01) |

(52) U.S. Cl.
CPC ....... *H01R 13/6599* (2013.01); *G06K 7/0013* (2013.01); *H01R 9/09* (2013.01); *H01R 12/716* (2013.01); *H01R 12/721* (2013.01); *H01R 13/6586* (2013.01); *H01R 13/65802* (2013.01); *H05K 2201/10325* (2013.01); *Y10T 29/49133* (2015.01)

(58) Field of Classification Search
CPC ....... G06K 7/0013; H05K 2201/10325; H01R 13/65802; H01R 9/09; H01R 13/6586; H01R 13/6587; H01R 13/6596; H01R 23/6893
USPC .... 361/679.31, 679.32, 679.33, 679.37, 728, 361/729, 731, 732, 733, 736, 737, 785, 361/788; 439/47, 325, 541.5, 607.4, 439/607.14, 607.22, 607.32, 607.36, 439/607.37, 607.38, 620.15, 620.16, 439/620.17, 821
See application file for complete search history.

(56) References Cited

U.S. PATENT DOCUMENTS

| | | | |
|---|---|---|---|
| 6,361,365 B1 * | 3/2002 | Yu | ............................ 439/607.22 |
| 6,749,465 B1 * | 6/2004 | Huang et al. | ................. 439/630 |
| 2014/0094063 A1 | 4/2014 | Daly | |

* cited by examiner

*Primary Examiner* — Binh Tran
(74) *Attorney, Agent, or Firm* — Todd B. Alder; Thorpe North & Western, LLP

(57) ABSTRACT

Apparatus, systems, and methods for signal referencing for memory are described. In one embodiment, connector for a memory device comprises a housing having a first panel and a second panel opposite the first panel to be positioned adjacent a circuit board, the first panel and second panel defining a slot to receive a portion of the memory device, a first plurality of electrically conductive pins disposed in the slot and proximate the first panel to establish electrical connections with a plurality of electrical connectors on the memory device, wherein at least one of the first plurality of pins is a ground pin and a layer of conductive material disposed proximate the second surface. The ground pin is electrically coupled to the layer of conductive material. Other embodiments are also disclosed and claimed.

11 Claims, 9 Drawing Sheets

SIGNAL REFERENCING FOR MEMORY

FIELD

The present disclosure generally relates to the field of electronics. More particularly, some embodiments of the invention generally relate to signal referencing for memory.

BACKGROUND

Electronic devices such as computer systems commonly include memory systems such as dual in-line memory modules (DIMMs) to provide operating memory for the device. DIMMs have typically been mounted on a card which is coupled a motherboard in a vertical orientation, i.e., perpendicular to the motherboard. Some electronic devices which have thin form factors, e.g., notebook computers, tablet computers, electronic readers, and the like utilize connectors which position the memory modules parallel to the motherboard. As such, signals that are routed to the top side of the memory module travel a longer signal path than signals routed to the bottom side of the memory module and also exit a reference plane that may be formed below pins on the bottom side of the memory module.

The longer signal path and new technologies with higher signal to ground ratios increase crosstalk on the signals that are routed to the top side of the memory module. This in turn affects signal integrity and ultimately affects the speed capability of the entire memory module. Accordingly, techniques to improve signal referencing in memory may find utility.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

DETAILED DESCRIPTION

In the following description, numerous specific details are set forth in order to provide a thorough understanding of various embodiments. However, various embodiments of the invention may be practiced without the specific details. In other instances, well-known methods, procedures, components, and circuits have not been described in detail so as not to obscure the particular embodiments of the invention. Further, various aspects of embodiments of the invention may be performed using various means, such as integrated semiconductor circuits ("hardware"), computer-readable instructions organized into one or more programs ("software"), or some combination of hardware and software. For the purposes of this disclosure reference to "logic" shall mean either hardware, software, or some combination thereof.

As described above, electronic devices which have a thin form factor may require memory cards to be positioned parallel to a circuit board, e.g., the motherboard of the device. This raises issues which degrade signal integrity. Described herein is a connector which provides for signal referencing for the memory connectors to improve signal integrity. The connector may be coupled to a circuit board of an electronic device and may receive a memory device, e.g., a DIMM card or the like.

Figure 1:
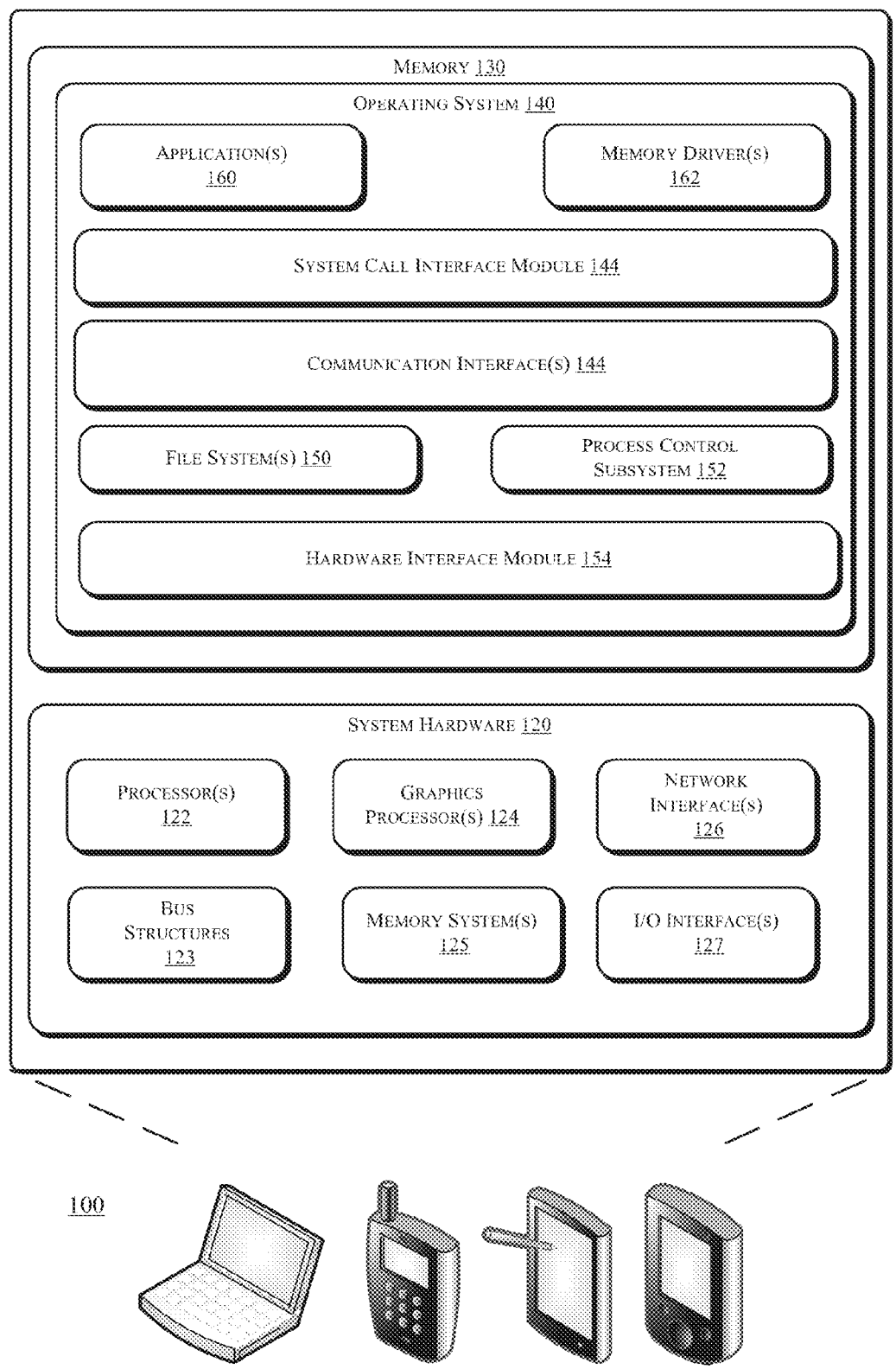
FIG. 1 is a schematic, block diagram illustration of components of apparatus to implement signal referencing for memory in accordance with various embodiments discussed herein.

FIG. 1 is a schematic illustration of an exemplary electronic device 100 which may be adapted implement signal referencing for memory as described herein, in accordance with some embodiments. In various embodiments, the electronic device 100 may be embodied as a personal computer, a laptop computer, a personal digital assistant, a mobile telephone, an entertainment device, a tablet computer, an electronic reader, or another computing device.

The electronic device 100 includes system hardware 120 and memory 130, which may be implemented as random access memory and/or read-only memory. A power source such as a battery may be coupled to the electronic device 100.

System hardware 120 may include one or more processors 122, bus structures 123, one or more graphics processors 124, memory systems 125, network interfaces 126, and input/output interfaces 127. In one embodiment, processor 122 may be embodied as an Intel® Core2 Duo® processor available from Intel Corporation, Santa Clara, Calif., USA. As used herein, the term "processor" means any type of computational element, such as but not limited to, a microprocessor, a microcontroller, a complex instruction set computing (CISC) microprocessor, a reduced instruction set (RISC) microprocessor, a very long instruction word (VLIW) microprocessor, or any other type of processor or processing circuit.

Bus structures 123 connect various components of system hardware 120. In one embodiment, bus structures 128 may be one or more of several types of bus structure(s) including a memory bus, a peripheral bus or external bus, and/or a local bus using any variety of available bus architectures including, but not limited to, 11-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), and Small Computer Systems Interface (SCSI).

Graphics processor(s) 124 may function as an adjunct processor that manages graphics and/or video operations. Graphics processor(s) 124 may be integrated onto the motherboard of electronic device 100 or may be coupled via an expansion slot on the motherboard.

Memory systems 125 may comprise local memory, e.g., cache memory, one or more forms of volatile memory and nonvolatile memory, as described above.

In one embodiment, network interface(s) 126 could be a wired interface such as an Ethernet interface (see, e.g., Institute of Electrical and Electronics Engineers/IEEE 802.3-2002) or a wireless interface such as an IEEE 802.11a, b or g-compliant interface (see, e.g., IEEE Standard for IT-Telecommunications and information exchange between systems LAN/MAN-Part II: Wireless LAN Medium Access Control (MAC) and Physical Layer (PHY) specifications Amendment 4: Further Higher Data Rate Extension in the 2.4 GHz Band, 802.11G-2003). Another example of a wireless interface would be a general packet radio service (GPRS) interface (see, e.g., Guidelines on GPRS Handset Requirements, Global System for Mobile Communications/ GSM Association, Ver. 3.0.1, December 2002).

I/O interface(s) 127 may be implemented on one or more I/O devices, e.g., a display, a touch screen, one or more speakers, a keyboard, a mouse, a touchpad, or the like.

Memory 130 may store an operating system 140 for managing operations of electronic device 100. In one embodiment, operating system 140 includes a hardware interface module 154, e.g., a one or more device drivers, that provides an interface to system hardware 120. In addition, operating system 140 may include a file system 150 that manages files used in the operation of electronic device 100 and a process control subsystem 152 that manages processes executing on electronic device 100.

Operating system 140 may include (or manage) one or more communication interfaces that may operate in conjunction with system hardware 120 to transceive data packets and/or data streams from a remote source. Operating system 140 may further include a system call interface module 142 that provides an interface between the operating system 140 and one or more application modules resident in memory 130. Operating system 140 may be embodied as a UNIX operating system or any derivative thereof (e.g., Linux, Solaris, etc.) or as a Windows® brand operating system, or other operating systems.

In some embodiments memory 130 may store one or more applications 160 which may execute on the one or more processors 122 under the supervision of operating system 140 and one or more memory drivers 162. The applications 160 and driver 162 may be embodied as logic instructions stored in a tangible, non-transitory computer readable medium (i.e., software or firmware) which may be executable on one or more of the processors 122. Alternatively, these applications may be embodied as logic on a programmable device such as a field programmable gate array (FPGA) or the like. Alternatively, these applications may be reduced to logic that may be hardwired into an integrated circuit.

Figure 2:
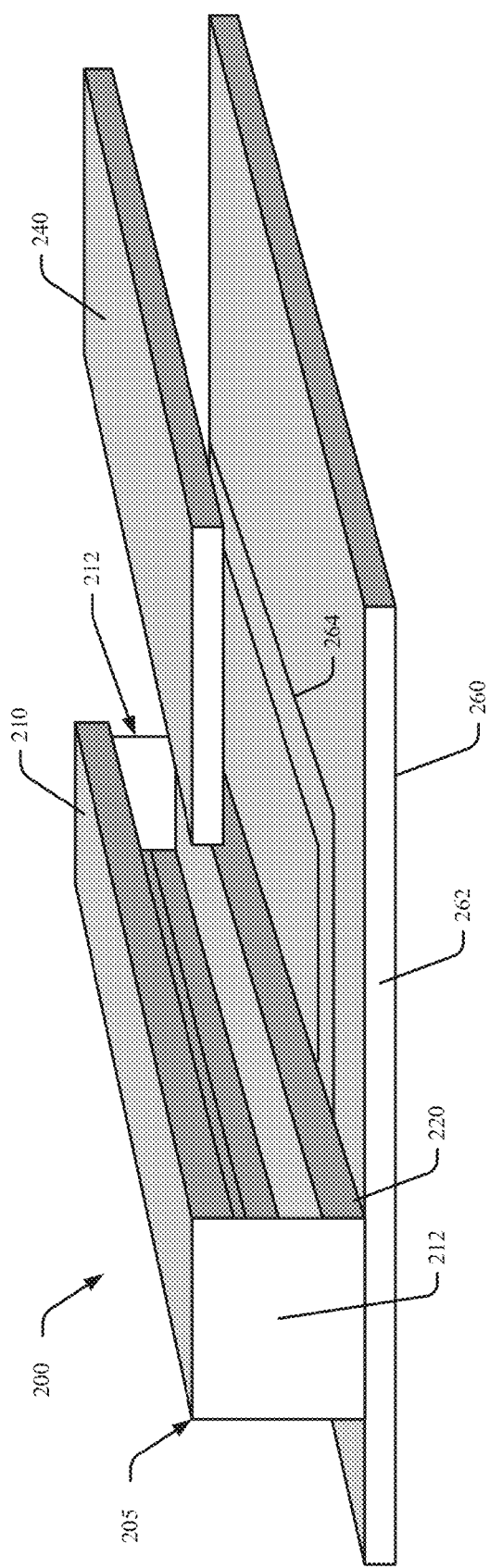
FIG. 2 is a schematic, block diagram illustration of components of apparatus to implement signal referencing for memory in accordance with various embodiments discussed herein.
Figure 3:
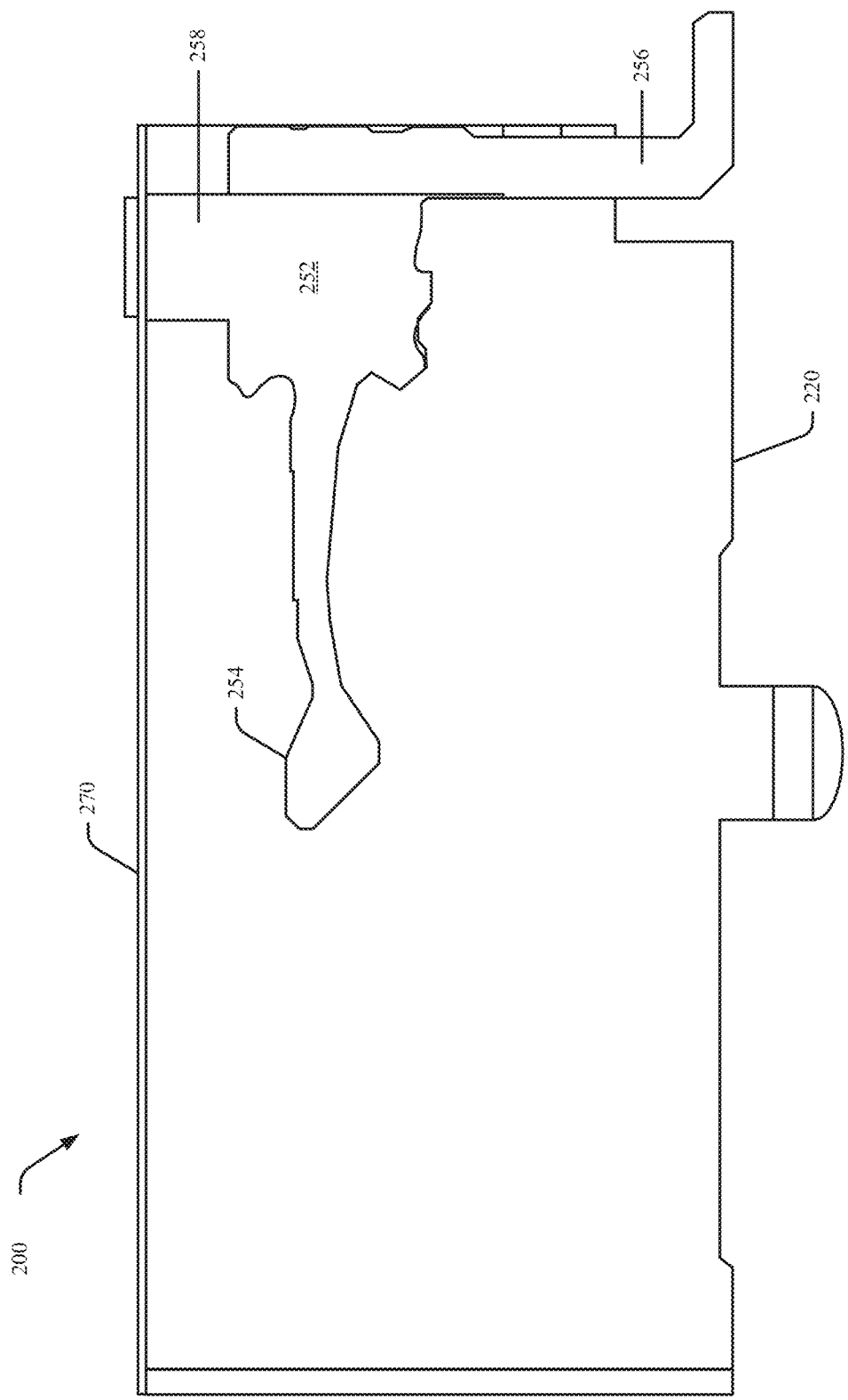
FIGS. 3-4 are schematic, block diagram illustrations of a connector which may be used in conjunction with an apparatus to implement signal referencing for memory in accordance with various embodiments discussed herein.
Figure 4:
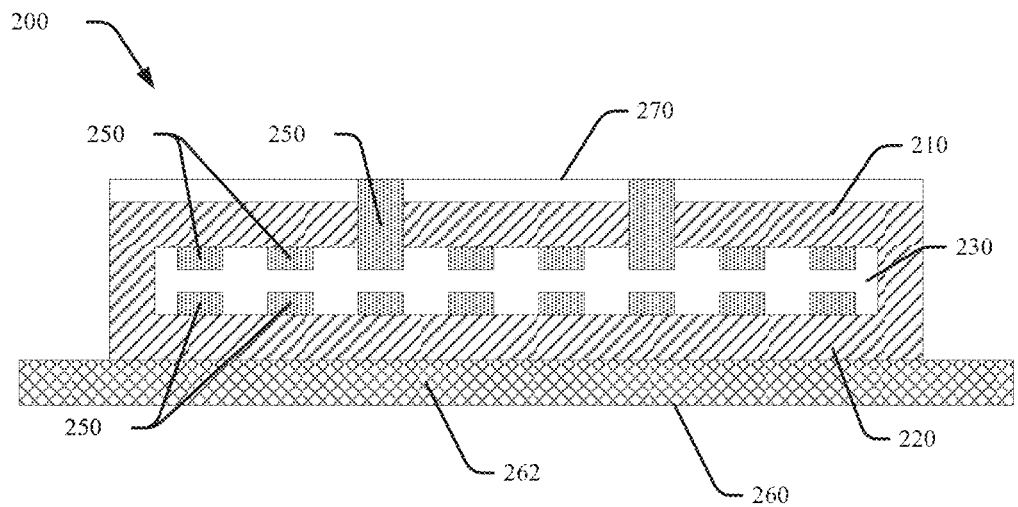

Apparatus and environments for signal referencing for memory will be described with reference to FIGS. 2-4. FIG. 2 is a schematic, block diagram illustration of components of apparatus to implement signal referencing for memory in accordance with various embodiments discussed herein. FIGS. 3-4 are schematic, block diagram illustrations of a connector which may be used in conjunction with an apparatus to implement signal referencing for memory in accordance with various embodiments discussed herein.

Referring to FIGS. 2-4, a connector 200 to couple a memory device 240 to a circuit board 260 comprises a housing 205 having a first panel 210 and a second panel 220 opposite the first panel 210. The second panel 220 may positioned adjacent the circuit board 260. Housing 205 may further comprise opposing end panels 212, and may be constructed from a suitable rigid material, e.g., a non-conductive polymer or the like.

A layer of conductive material 270 is disposed proximate to the second panel 220. In some embodiments the layer of conductive material may comprise a metallic film which may be deposited, e.g., by spraying, sputter depositing, or the like on the first panel 210. In other embodiments the layer of conductive material 270 may comprise a thin sheet of metal which may be secured to the first surface 210 of housing by an adhesive material. In further embodiments, the layer of conductive material 270 may be formed integrally with the first panel 210.

The first panel 210 and second panel 220 define a slot 230 (FIG. 3) to receive a portion of the memory device 240. A first plurality of electrically conductive pins 250 is disposed in the slot 230 and proximate the first panel 210 to establish electrical connections with the memory device 240. Similarly, a second plurality of electrically conductive pins 250 is disposed in the slot 230 and proximate to the second panel 220 to establish electrical connections with the memory device 230. In some embodiments the memory device 240 is a DIMM card which is to be inserted into the slot 230 in an orientation that is approximately parallel to the circuit board 260.

At least one of the first plurality of pins 250 is a ground pin. In some embodiments ground pin 250 comprises a body 252, a contact arm 254, and a solder tail 256. A tab 258 electrically couples the ground pin 250 to the layer of conductive material 270. In some embodiments the tab 258 may be formed as an integral part of ground pin 250, as illustrated in FIG. 3. In other embodiments the tab 258 may be formed as a separate component which may be electrically connected to tab 250. By way of example, in some embodiments the first panel 210 may be formed with one or more apertures, or slots, in locations which correspond to the locations of ground pins 250. In embodiments in which the layer of conductive material 270 is sprayed onto the first panel 210 the conductive material 270 will fill the apertures, or slots, to define a tab 258 to provide an electrical connection with the ground pin 250.

The layer of conductive material 270 provides a ground plane, which in turn provides a reference signal for the pins 250 on the first panel 210 of the housing 205.

Figure 5:
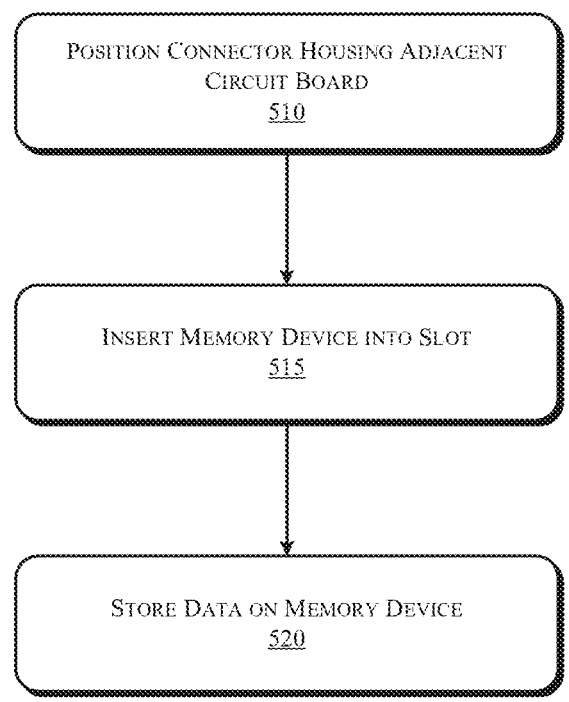
FIG. 5 is a flowchart illustrating operations in a method to implement signal referencing for memory in accordance with various embodiments discussed herein.

FIG. 5 is a flowchart illustrating operations in a method to implement signal referencing for memory in accordance with various embodiments discussed herein. Referring to FIG. 5, at operation 510 a connector 200 is positioned proximate to the circuit board 260. At operation 515 the memory device 240 is inserted into the slot 230 to connect the memory device 240 to the pins 250 in the connector. Thereafter, data may be stored on the memory device 240 (operation 520).

Figure 6:
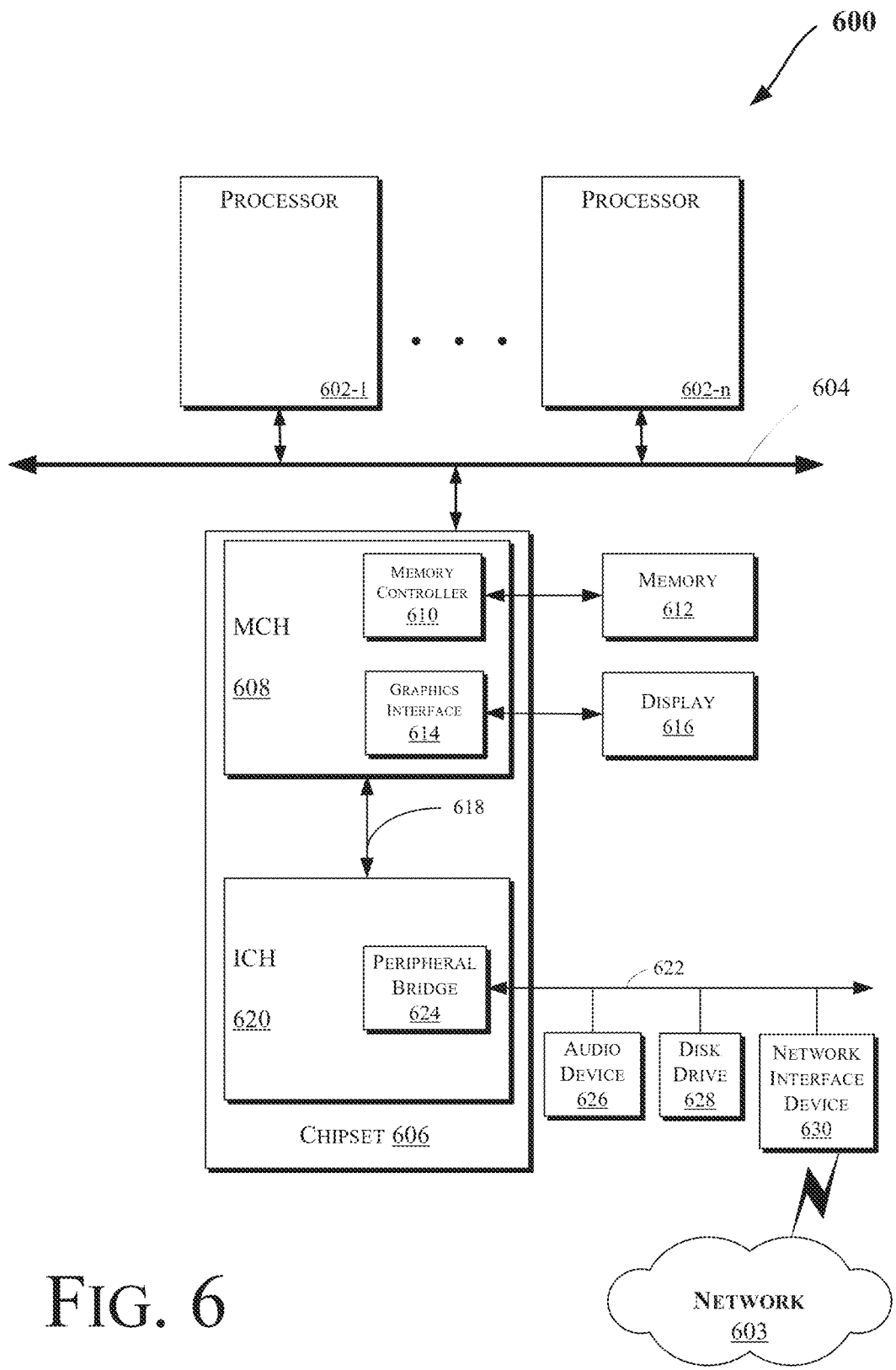
FIGS. 6-10 are schematic, block diagram illustrations of electronic devices which may be adapted to implement signal referencing for memory in accordance with various embodiments discussed herein.

As described above, in some embodiments the electronic device may be embodied as a computer system. FIG. 6 illustrates a block diagram of a computing system 600 in accordance with an embodiment of the invention. The computing system 600 may include one or more central processing unit(s) (CPUs) 602 or processors that communicate via an interconnection network (or bus) 604. The processors 602 may include a general purpose processor, a network processor (that processes data communicated over a computer network 603), or other types of a processor (including a reduced instruction set computer (RISC) processor or a complex instruction set computer (CISC)). Moreover, the processors 602 may have a single or multiple core design. The processors 602 with a multiple core design may integrate different types of processor cores on the same integrated circuit (IC) die. Also, the processors 602 with a multiple core design may be implemented as symmetrical or asymmetrical multiprocessors. In an embodiment, one or more of the processors 602 may be the same or similar to the processors 102 of FIG. 1. For example, one or more of the processors 602 may include the control unit 120 discussed with reference to FIGS. 1-3. Also, the operations discussed with reference to FIGS. 3-5 may be performed by one or more components of the system 600.

A chipset 606 may also communicate with the interconnection network 604. The chipset 606 may include a memory control hub (MCH) 608. The MCH 608 may include a memory controller 610 that communicates with a memory 612 (which may be the same or similar to the memory 130 of FIG. 1). The memory 412 may store data, including sequences of instructions, that may be executed by the CPU 602, or any other device included in the computing system 600. In one embodiment of the invention, the memory 612 may include one or more volatile storage (or memory) devices such as random access memory (RAM), dynamic RAM (DRAM), synchronous DRAM (SDRAM), static RAM (SRAM), or other types of storage devices. Nonvolatile memory may also be utilized such as a hard disk. Additional devices may communicate via the interconnection network 604, such as multiple CPUs and/or multiple system memories.

The MCH 608 may also include a graphics interface 614 that communicates with a display device 616. In one embodiment of the invention, the graphics interface 614 may communicate with the display device 616 via an accelerated graphics port (AGP). In an embodiment of the invention, the display 616 (such as a flat panel display) may communicate with the graphics interface 614 through, for example, a signal converter that translates a digital representation of an image stored in a storage device such as video memory or system memory into display signals that are interpreted and displayed by the display 616. The display signals produced by the display device may pass through various control devices before being interpreted by and subsequently displayed on the display 616.

A hub interface 618 may allow the MCH 608 and an input/output control hub (ICH) 620 to communicate. The ICH 620 may provide an interface to I/O device(s) that communicate with the computing system 600. The ICH 620 may communicate with a bus 622 through a peripheral bridge (or controller) 624, such as a peripheral component interconnect (PCI) bridge, a universal serial bus (USB) controller, or other types of peripheral bridges or controllers. The bridge 624 may provide a data path between the CPU 602 and peripheral devices. Other types of topologies may be utilized. Also, multiple buses may communicate with the ICH 620, e.g., through multiple bridges or controllers. Moreover, other peripherals in communication with the ICH 620 may include, in various embodiments of the invention, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), or other devices.

The bus 622 may communicate with an audio device 626, one or more disk drive(s) 628, and a network interface device 630 (which is in communication with the computer network 603). Other devices may communicate via the bus 622. Also, various components (such as the network interface device 630) may communicate with the MCH 608 in some embodiments of the invention. In addition, the processor 602 and one or more other components discussed herein may be combined to form a single chip (e.g., to provide a System on Chip (SOC)). Furthermore, the graphics accelerator 616 may be included within the MCH 608 in other embodiments of the invention.

Furthermore, the computing system 600 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 628), a floppy disk, a compact disk ROM (CD-ROM), a digital versatile disk (DVD), flash memory, a magneto-optical disk, or other types of nonvolatile machine-readable media that are capable of storing electronic data (e.g., including instructions).

Figure 7:
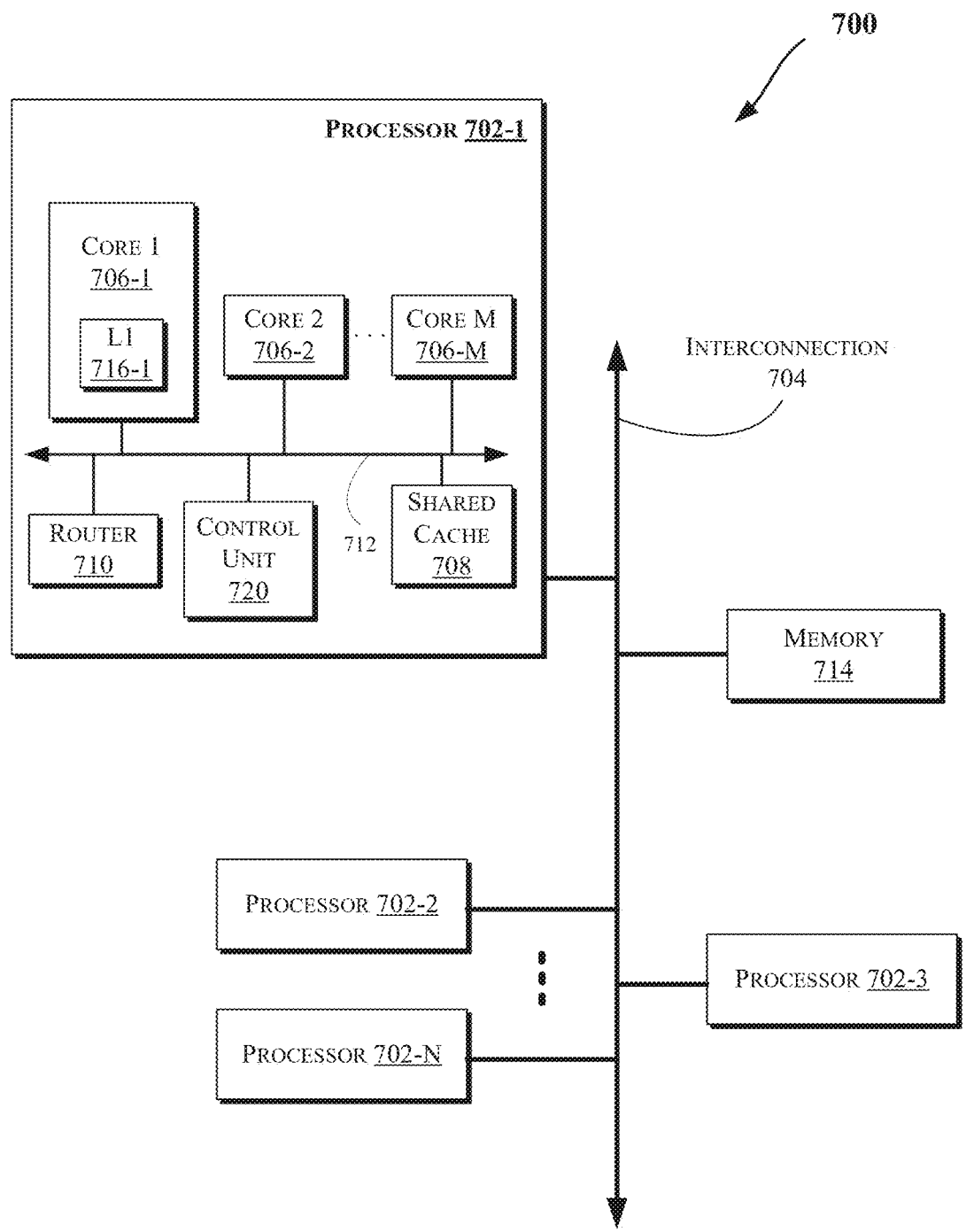

FIG. 7 illustrates a block diagram of a computing system 700, according to an embodiment of the invention. The system 700 may include one or more processors 702-1 through 702-N (generally referred to herein as "processors 702" or "processor 702"). The processors 702 may communicate via an interconnection network or bus 704. Each processor may include various components some of which are only discussed with reference to processor 702-1 for clarity. Accordingly, each of the remaining processors 702-2 through 702-N may include the same or similar components discussed with reference to the processor 702-1.

In an embodiment, the processor 702-1 may include one or more processor cores 706-1 through 706-M (referred to herein as "cores 706" or more generally as "core 706"), a shared cache 708, a router 710, and/or a processor control logic or unit 720. The processor cores 706 may be implemented on a single integrated circuit (IC) chip. Moreover, the chip may include one or more shared and/or private caches (such as cache 708), buses or interconnections (such as a bus or interconnection network 712), memory controllers, or other components.

In one embodiment, the router 710 may be used to communicate between various components of the processor 702-1 and/or system 700. Moreover, the processor 702-1 may include more than one router 710. Furthermore, the multitude of routers 710 may be in communication to enable data routing between various components inside or outside of the processor 702-1.

The shared cache 708 may store data (e.g., including instructions) that are utilized by one or more components of the processor 702-1, such as the cores 706. For example, the shared cache 708 may locally cache data stored in a memory 714 for faster access by components of the processor 702. In an embodiment, the cache 708 may include a mid-level cache (such as a level 2 (L2), a level 3 (L3), a level 4 (L4), or other levels of cache), a last level cache (LLC), and/or combinations thereof. Moreover, various components of the processor 702-1 may communicate with the shared cache 708 directly, through a bus (e.g., the bus 712), and/or a memory controller or hub. As shown in FIG. 7, in some embodiments, one or more of the cores 706 may include a level 1 (L1) cache 716-1 (generally referred to herein as "L1 cache 716"). In one embodiment, the control unit 720 may include logic to implement the operations described above with reference to the memory controller 122 in FIG. 2.

Figure 8:
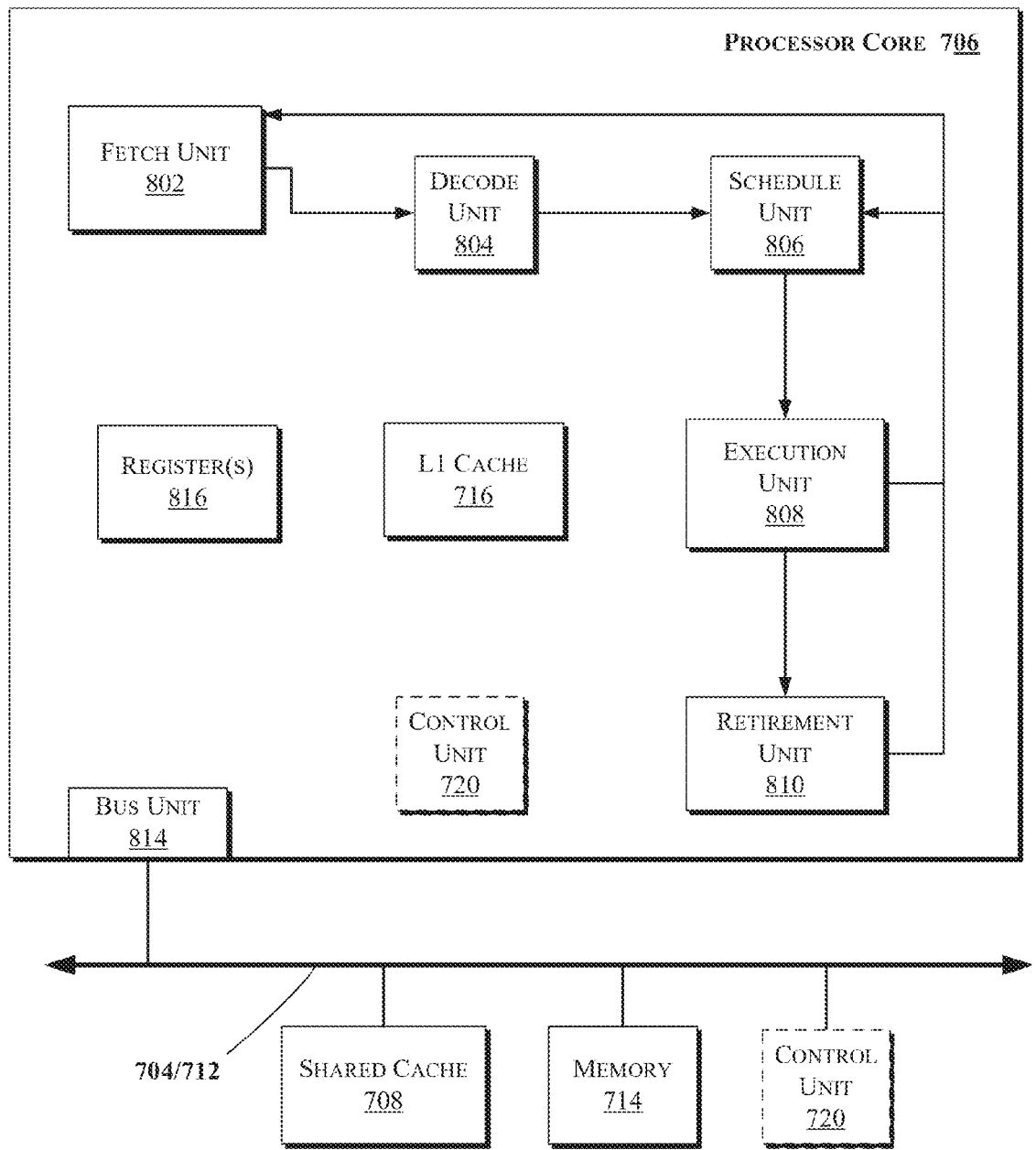

FIG. 8 illustrates a block diagram of portions of a processor core 706 and other components of a computing system, according to an embodiment of the invention. In one embodiment, the arrows shown in FIG. 8 illustrate the flow direction of instructions through the core 706. One or more processor cores (such as the processor core 706) may be implemented on a single integrated circuit chip (or die) such as discussed with reference to FIG. 7. Moreover, the chip may include one or more shared and/or private caches (e.g., cache 708 of FIG. 7), interconnections (e.g., interconnections 704 and/or 112 of FIG. 7), control units, memory controllers, or other components.

As illustrated in FIG. 8, the processor core 706 may include a fetch unit 802 to fetch instructions (including instructions with conditional branches) for execution by the core 706. The instructions may be fetched from any storage devices such as the memory 714. The core 706 may also include a decode unit 804 to decode the fetched instruction. For instance, the decode unit 804 may decode the fetched instruction into a plurality of uops (micro-operations).

Additionally, the core 706 may include a schedule unit 806. The schedule unit 806 may perform various operations associated with storing decoded instructions (e.g., received from the decode unit 804) until the instructions are ready for dispatch, e.g., until all source values of a decoded instruction become available. In one embodiment, the schedule unit 806 may schedule and/or issue (or dispatch) decoded instructions to an execution unit 808 for execution. The execution unit 808 may execute the dispatched instructions after they are decoded (e.g., by the decode unit 804) and dispatched (e.g., by the schedule unit 806). In an embodiment, the execution unit 808 may include more than one execution unit. The execution unit 808 may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit 808.

Further, the execution unit 808 may execute instructions out-of-order. Hence, the processor core 706 may be an out-of-order processor core in one embodiment. The core 706 may also include a retirement unit 810. The retirement unit 810 may retire executed instructions after they are committed. In an embodiment, retirement of the executed instructions may result in processor state being committed from the execution of the instructions, physical registers used by the instructions being de-allocated, etc.

The core 706 may also include a bus unit 714 to enable communication between components of the processor core 706 and other components (such as the components discussed with reference to FIG. 8) via one or more buses (e.g., buses 804 and/or 812). The core 706 may also include one or more registers 816 to store data accessed by various components of the core 706 (such as values related to power consumption state settings).

Furthermore, even though FIG. 7 illustrates the control unit 720 to be coupled to the core 706 via interconnect 812, in various embodiments the control unit 720 may be located elsewhere such as inside the core 706, coupled to the core via bus 704, etc.

Figure 9:
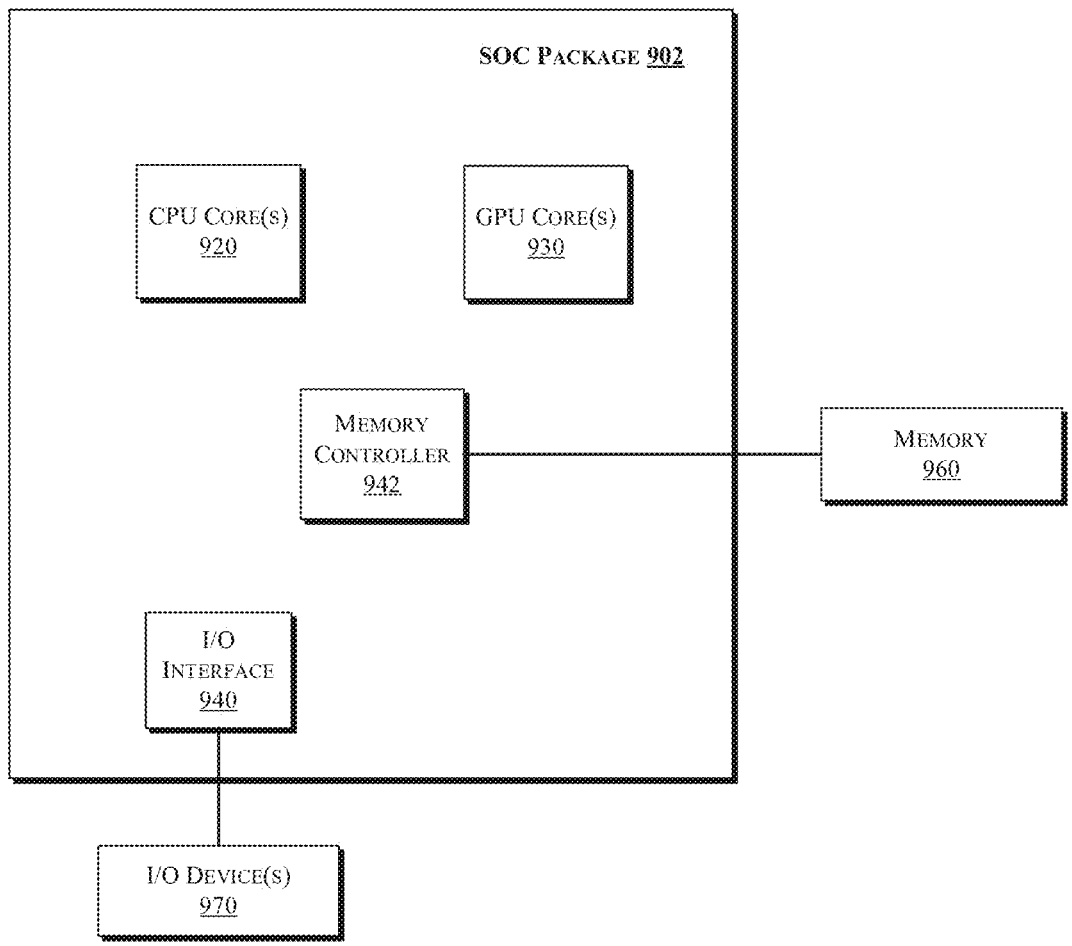

In some embodiments, one or more of the components discussed herein can be embodied as a System On Chip (SOC) device. FIG. 9 illustrates a block diagram of an SOC package in accordance with an embodiment. As illustrated in FIG. 9, SOC 902 includes one or more Central Processing Unit (CPU) cores 920, one or more Graphics Processor Unit (GPU) cores 930, an Input/Output (I/O) interface 940, and a memory controller 942. Various components of the SOC package 902 may be coupled to an interconnect or bus such as discussed herein with reference to the other figures. Also, the SOC package 902 may include more or less components, such as those discussed herein with reference to the other figures. Further, each component of the SOC package 902 may include one or more other components, e.g., as discussed with reference to the other figures herein. In one embodiment, SOC package 902 (and its components) is provided on one or more Integrated Circuit (IC) die, e.g., which are packaged into a single semiconductor device.

As illustrated in FIG. 9, SOC package 902 is coupled to a memory 960 (which may be similar to or the same as memory discussed herein with reference to the other figures) via the memory controller 942. In an embodiment, the memory 960 (or a portion of it) can be integrated on the SOC package 902.

The I/O interface 940 may be coupled to one or more I/O devices 970, e.g., via an interconnect and/or bus such as discussed herein with reference to other figures. I/O device(s) 970 may include one or more of a keyboard, a mouse, a touchpad, a display, an image/video capture device (such as a camera or camcorder/video recorder), a touch screen, a speaker, or the like.

Figure 10:
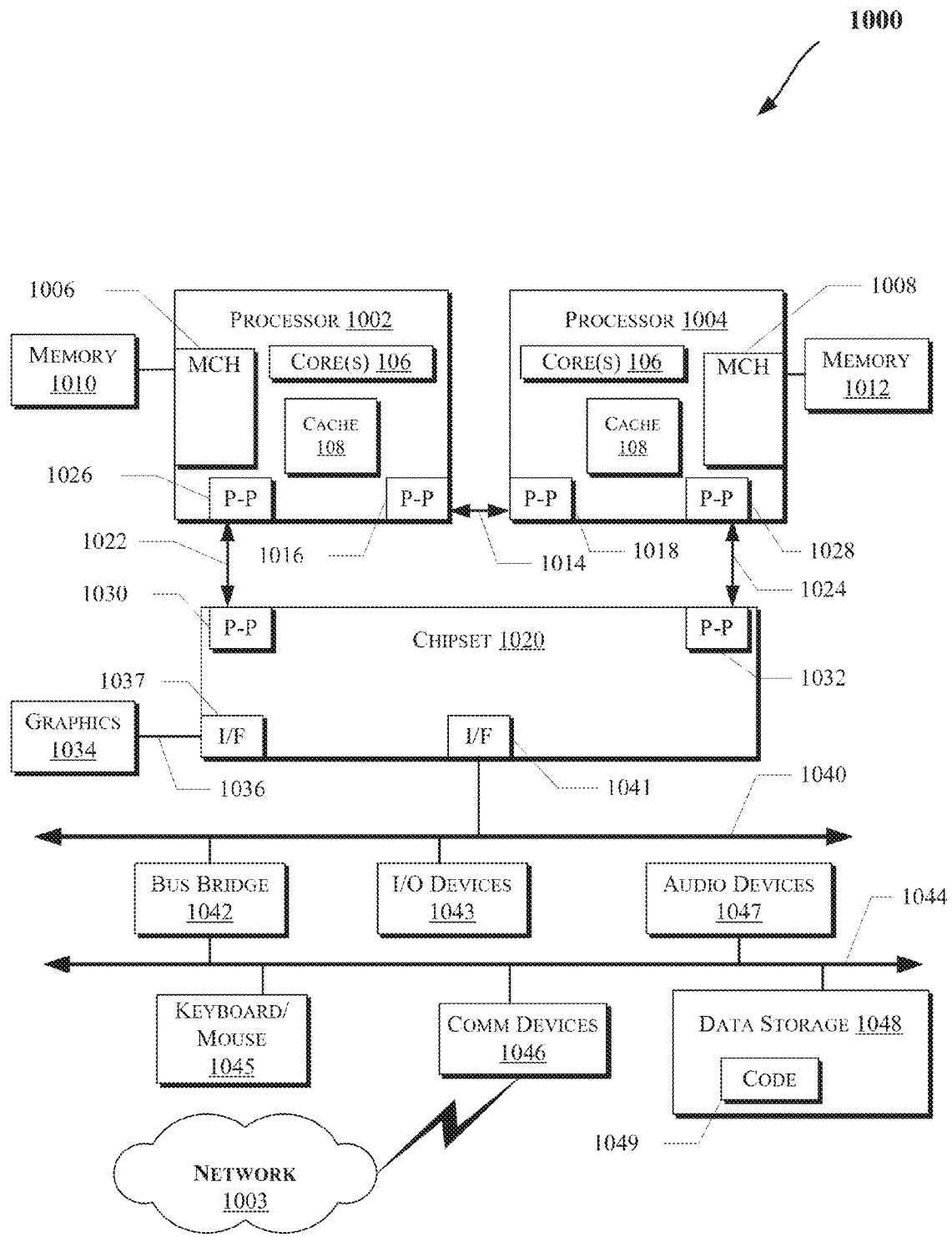

FIG. 10 illustrates a computing system 1000 that is arranged in a point-to-point (PtP) configuration, according to an embodiment of the invention. In particular, FIG. 10 shows a system where processors, memory, and input/output devices are interconnected by a number of point-to-point interfaces. The operations discussed with reference to FIG. 2 may be performed by one or more components of the system 1000.

As illustrated in FIG. 10, the system 1000 may include several processors, of which only two, processors 1002 and 1004 are shown for clarity. The processors 1002 and 1004 may each include a local memory controller hub (MCH) 1006 and 1008 to enable communication with memories 1010 and 1012. MCH 1006 and 1008 may include the memory controller 120 and/or logic 125 of FIG. 1 in some embodiments.

In an embodiment, the processors 1002 and 1004 may be one of the processors 702 discussed with reference to FIG. 7. The processors 1002 and 1004 may exchange data via a point-to-point (PtP) interface 1014 using PtP interface circuits 1016 and 1018, respectively. Also, the processors 1002 and 1004 may each exchange data with a chipset 1020 via individual PtP interfaces 1022 and 1024 using point-to-point interface circuits 1026, 1028, 1030, and 1032. The chipset 1020 may further exchange data with a high-performance graphics circuit 1034 via a high-performance graphics interface 1036, e.g., using a PtP interface circuit 1037.

As shown in FIG. 10, one or more of the cores 106 and/or cache 108 of FIG. 1 may be located within the processors 902 and 904. Other embodiments of the invention, however, may exist in other circuits, logic units, or devices within the system 900 of FIG. 9. Furthermore, other embodiments of the invention may be distributed throughout several circuits, logic units, or devices illustrated in FIG. 9.

The chipset 920 may communicate with a bus 940 using a PtP interface circuit 941. The bus 940 may have one or more devices that communicate with it, such as a bus bridge 942 and I/O devices 943. Via a bus 944, the bus bridge 943 may communicate with other devices such as a keyboard/mouse 945, communication devices 946 (such as modems, network interface devices, or other communication devices that may communicate with the computer network 803), audio I/O device, and/or a data storage device 948. The data storage device 948 (which may be a hard disk drive or a NAND flash based solid state drive) may store code 949 that may be executed by the processors 902 and/or 904.

The following examples pertain to further embodiments.

Example 1 is a connector for a memory device, comprising a housing having a first panel and a second panel opposite the first panel to be positioned adjacent a circuit board, the first panel and second panel defining a slot to receive a portion of the memory device, a first plurality of electrically conductive pins disposed in the slot and proximate to the first panel to establish electrical connections with the memory device, wherein at least one of the first plurality of pins is a ground pin, and a layer of conductive material disposed proximate to the second panel, wherein the ground pin is electrically coupled to the layer of conductive material.

In Example 2, the housing of Example 1 can optionally be formed from a material that is not electrically conductive.

In Example 3, the subject matter of Examples 1-2 can optionally include a layer of conductive material formed on a surface of the first panel.

In Example 4, the subject matter of any one of Examples 1-3 can optionally include a ground pin which comprises a tab to provide an electrical connection with the layer of conductive material.

In Example 5, the subject matter of any one of Examples 1-4 can optionally include a tab which extends through a portion of the first panel.

In Example 6, the subject matter of any one of Examples 1-5 can optionally include a second plurality of electrically conductive pins disposed in the slot and proximate the second panel to establish electrical connections with the memory device.

Example 7 is a circuit board for an electronic device comprising a dielectric substrate comprising a plurality of circuit traces, and a connector for a memory device coupled to the circuit board, the connector comprising a housing having a first panel and a second panel opposite the first panel to be positioned adjacent a circuit board, the first panel and second panel defining a slot to receive a portion of the memory device, a first plurality of electrically conductive pins disposed in the slot and proximate the first panel to establish electrical connections with a the memory device, wherein at least one of the first plurality of pins is a ground pin, and a layer of conductive material disposed proximate the second panel, wherein the ground pin is electrically coupled to the layer of conductive material.

In Example 8, the housing of Example 7 can optionally be formed from a material that is not electrically conductive.

In Example 9, the subject matter of Examples 7-8 can optionally include a layer of conductive material formed on a surface of the first panel.

In Example 10, the subject matter of any one of Examples 7-9 can optionally include a ground pin which comprises a tab to provide an electrical connection with the layer of conductive material.

In Example 11, the subject matter of any one of Examples 7-10 can optionally include a tab which extends through a portion of the first panel.

In Example 12, the subject matter of any one of Examples 7-11 can optionally include a second plurality of electrically conductive pins disposed in the slot and proximate the second panel to establish electrical connections with the memory device.

Example 13 is an electronic device comprising at least one electronic component, a circuit board for an electronic device, comprising a dielectric substrate comprising a plurality of circuit traces, and a connector for a memory device coupled to the circuit board, the connector comprising, a housing having a first panel and a second panel opposite the first panel to be positioned adjacent a circuit board, the first panel and second panel defining a slot to receive a portion of the memory device, a first plurality of electrically conductive pins disposed in the slot and proximate the first panel to establish electrical connections with a the memory device, wherein at least one of the first plurality of pins is a ground pin, and a layer of conductive material disposed proximate the second panel, wherein the ground pin is electrically coupled to the layer of conductive material.

In Example 14, the housing of Example 13 can optionally be formed from a material that is not electrically conductive.

In Example 15, the subject matter of Examples 13-14 can optionally include a layer of conductive material formed on a surface of the first panel.

In Example 16, the subject matter of any one of Examples 13-15 can optionally include a ground pin which comprises a tab to provide an electrical connection with the layer of conductive material.

In Example 17, the subject matter of any one of Examples 13-16 can optionally include a tab which extends through a portion of the first panel.

In Example 18, the subject matter of any one of Examples 13-17 can optionally include a second plurality of electrically conductive pins disposed in the slot and proximate the second panel to establish electrical connections with the memory device.

Example 19 is a method to couple a memory device to a circuit board, comprising, positioning a housing adjacent a circuit board, the housing comprising, a first panel and a second panel opposite the first panel, the first panel and second panel defining a slot to receive a portion of the memory device, a first plurality of electrically conductive pins disposed in the slot and proximate the first panel to establish electrical connections with a plurality of electrical connectors on the memory device, wherein at least one of the first plurality of pins is a ground pin, and a layer of conductive material disposed proximate the second surface, wherein the ground pin is electrically coupled to the layer of conductive material and inserting a portion of the memory device into the slot.

In Example 20, the subject matter of Example 19 can optionally include storing data on the memory device.

In various embodiments of the invention, the operations discussed herein, e.g., with reference to FIG. 5, may be implemented as hardware (e.g., circuitry), software, firmware, microcode, or combinations thereof, which may be provided as a computer program product, e.g., including a tangible (e.g., non-transitory) machine-readable or computer-readable medium having stored thereon instructions (or software procedures) used to program a computer to perform a process discussed herein. Also, the term "logic" may include, by way of example, software, hardware, or combinations of software and hardware. The machine-readable medium may include a storage device such as those discussed herein.

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments of the invention, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments of the invention have been described in language specific to structural features and/or methodological acts, it is to be understood that claimed subject matter may not be limited to the specific features or acts described. Rather, the specific features and acts are disclosed as sample forms of implementing the claimed subject matter.

The invention claimed is:

1. A connector for a memory device, comprising:
a housing having a first panel and a second panel opposite the first panel to be positioned adjacent a circuit board, the first panel and second panel defining a slot to receive a portion of the memory device;
a first plurality of electrically conductive pins disposed in the slot along the first panel to establish electrical connections with conductive pins on a first side of the memory device, wherein at least one of the first plurality of pins is a ground pin;
at least one aperture formed in the first panel and positioned at a location corresponding to a location of the ground pin;
a layer of conductive material formed on the first panel such that the conductive material fills the at least one aperture to define a tab to provide an electrical connection with the ground pin, wherein the layer of conductive material forms a first ground plane to which the first plurality of pins is referenced; and
a second plurality of electrically conductive pins disposed in the slot along the second panel to establish electrical connections with conductive pins on a second side of the memory device, where the second plurality of pins is referenced to a second ground plane at the circuit board.

2. The connector of claim 1, wherein the housing is formed from a material that is not electrically conductive.

3. The connector of claim 1, wherein the tab extends through a portion of the first panel.

4. A circuit board for an electronic device, comprising:
a dielectric substrate comprising a plurality of circuit traces; and
a connector for a memory device coupled to the circuit board, the connector comprising:
a housing positioned adjacent the circuit board, the housing comprising a first panel and a second panel opposite the first panel, the first panel and the second panel defining a slot to receive a portion of the memory device;
a first plurality of electrically conductive pins disposed in the slot along the first panel to establish electrical connections with conductive pins on a first side of the memory device, wherein at least one of the first plurality of pins is a ground pin;
at least one aperture formed in the first panel and positioned at a location corresponding to a location of the ground pin;
a layer of conductive material formed on the first panel such that the conductive material fills the at least one aperture to define a tab to provide an electrical connection with the ground pin, wherein the layer of conductive material forms a first ground plane to which the first plurality of pins is referenced; and
a second plurality of electrically conductive pins disposed in the slot along the second panel to establish electrical connections with conductive pins on a second side of the memory device, wherein the second plurality of pins is referenced to a second ground plane at the circuit board.

5. The circuit board of claim 4, wherein the housing is formed from a material that is not electrically conductive.

6. The circuit board of claim 4, wherein the tab extends through a portion of the first panel.

7. An electronic device, comprising:
at least one electronic component; and
a circuit board for the electronic device, comprising:
a dielectric substrate comprising a plurality of circuit traces; and
a connector for a memory device coupled to the circuit board, the connector comprising:
a housing positioned adjacent the circuit board, the housing comprising a first panel and a second panel opposite the first panel and, the first panel and second panel defining a slot to receive a portion of the memory device;
a first plurality of electrically conductive pins disposed in the slot along the first panel to establish electrical connections with conductive pins on a first side of the memory device, wherein at least one of the first plurality of pins is a ground pin;
at least one aperture formed in the first panel and positioned at a location corresponding to a location of the ground pin;
a layer of conductive material formed on the first panel such that the conductive material fills the at least one aperture to define a tab to provide an electrical connection with the ground pin, wherein the layer of conductive material forms a first ground plane to which the first plurality of pins is reference; and
a second plurality of electrically conductive pins disposed in the slot along the second panel to establish electrical connections with conductive pins on a second side of the memory device, wherein the second plurality of pins is referenced to a second ground plane at the circuit board.

8. The electronic device of claim 7, wherein the housing is formed from a material that is not electrically conductive.

9. The electronic device of claim 7, wherein the tab extends through a portion of the first panel.

10. A method to couple a memory device to a circuit board, comprising:
positioning the memory device in a housing adjacent a circuit board, the housing comprising:
a first panel and a second panel opposite the first panel and positioned adjacent the circuit board, the first panel and the second panel defining a slot to receive a portion of the memory device;
a first plurality of electrically conductive pins disposed in the slot along the first panel to establish electrical connections with a plurality of conductive pins on a first side of the memory device, wherein at least one of the first plurality of pins is a ground pin;
at least one aperture formed in the first panel and positioned at a location corresponding to a location of the ground pin;
a layer of conductive material formed on the first panel such that the conductive material fills the at least one aperture to define a tab to provide an electrical connection with the ground pin, wherein the layer of conductive material forms a first ground plane to which the first plurality of pins is referenced; and
a second plurality of electrically conductive pins disposed in the slot along the second panel to establish electrical connections with conductive pins on a second side of the memory device, wherein the second plurality of pins is referenced to a second ground plane at the circuit board.

11. The method of claim 10, further comprising:
securing the memory device in the slot.

* * * * *